United States Patent
Akiyama et al.

(10) Patent No.: US 7,508,120 B2
(45) Date of Patent: Mar. 24, 2009

(54) PIEZOELECTRIC ELEMENT AND METHOD FOR MANUFACTURING

(75) Inventors: Morito Akiyama, Tosu (JP); Naohiro Ueno, Tosu (JP); Hiroshi Tateyama, Tosu (JP); Noriyuki Kuwano, Kasuga (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 366 days.

(21) Appl. No.: 10/543,119

(22) PCT Filed: Jan. 21, 2004

(86) PCT No.: PCT/JP2004/000466

§ 371 (c)(1),
(2), (4) Date: Jul. 22, 2005

(87) PCT Pub. No.: WO2004/066353

PCT Pub. Date: Aug. 5, 2004

(65) Prior Publication Data

US 2006/0131680 A1    Jun. 22, 2006

(30) Foreign Application Priority Data

Jan. 22, 2003   (JP)   ............................. 2003-013934

(51) Int. Cl.
*H01L 41/09*   (2006.01)
(52) U.S. Cl. ...................................... 310/358
(58) Field of Classification Search ................ 310/328, 310/311, 313, 358, 363, 313 A; 29/25.35; 73/715, 727; 257/416, 62.9, 62.9 PZ
See application file for complete search history.

(56) References Cited

U.S. PATENT DOCUMENTS 4,196,631 A * 4/1980 Deom et al. ................ 73/644
5,739,626 A    4/1998 Kojima et al.

(Continued)

FOREIGN PATENT DOCUMENTS

GB    2 405 257    2/2005

(Continued)

OTHER PUBLICATIONS

Office Action for Related Japanese Application No. 2003-013934 (7 pages).

*Primary Examiner*—Thomas M Dougherty
*Assistant Examiner*—Karen B Addison
(74) *Attorney, Agent, or Firm*—Edwards Angell Palmer & Dodge LLP; David G. Conlin; Lisa Swiszcz Hazzard

(57) ABSTRACT

A lower electrode is formed on a silica glass substrate or a stainless substrate. Through a sputtering process, a thin film of aluminum nitride and/or zinc oxide is formed on the lower substrate so that the degree of dipole-orientation becomes 55% or more, and thereby a piezoelectric thin film is formed. And an upper electrode is formed on the piezoelectric thin film.

A piezoelectric device has a piezoelectric layer made of aluminum nitride and/or zinc oxide. Aluminum nitride and zinc oxide with a crystal structure have inborn piezoelectric characteristics because their crystal structures are not symmetrical, they do not have Curie temperature unlike ferroelectrics, and in aluminum nitride and zinc oxide, magnetic transition does not occur even at high temperature, so that they never lose piezoelectric characteristics until crystal melts or sublimates.

20 Claims, 1 Drawing Sheet

U.S. PATENT DOCUMENTS

| | | | |
|---|---|---|---|
| 7,152,482 B2 * | 12/2006 | Ueno et al. | ................ 73/715 |
| 2004/0135144 A1 | 7/2004 | Yamada et al. | |
| 2006/0144154 A1 | 7/2006 | Ueno et al. | |

FOREIGN PATENT DOCUMENTS

| | | | |
|---|---|---|---|
| JP | 05-034230 | | 2/1993 |
| JP | 05-203665 | | 8/1993 |
| JP | 09-037391 | | 2/1997 |
| JP | 10-122948 | | 5/1998 |
| JP | 2004/125571 | | 4/2004 |
| JP | 2004-156991 | | 6/2004 |
| JP | 2004-184274 | | 7/2004 |
| JP | 2004-285899 | * | 9/2004 |
| WO | WO-02-093740 | | 11/2002 |
| WO | WO 03/103066 | * | 12/2003 |
| WO | WO-2004/031711 | | 4/2004 |

* cited by examiner

PIEZOELECTRIC ELEMENT AND METHOD FOR MANUFACTURING

CROSS REFERENCE TO RELATED APPLICATION

The present application is a 35 U.S.C. §371 national application of PCT/JP2004/000466 filed Jan. 21, 2004, which is incorporated herein by reference in its entirety.

TECHNICAL FIELD

The present invention relates to a piezoelectric device and a fabrication method thereof. Particularly, the present invention relates to a piezoelectric device made of a thin film in which aluminum nitride and/or zinc oxide is highly dipole-orientated on a substrate, and to a fabrication method thereof.

BACKGROUND ART

Conventionally, in order to sense abnormality of a structure that generates atmosphere of high temperature, such as a conduit or a valve of a plant (e.g. a nuclear power plant), or an internal combustion engine, a sensor is put inside the structure. Examples of the sensor are as follows; an acoustic emission sensor for sensing an acoustic emission that is an elastic wave generated when a crack or a crevice is made, and a piezoelectric vibration sensor for sensing information of an abnormal vibration or acceleration. As the examples of these sensors, a compressed type, a cantilevered type, a diaphragm type, and a shearing type are known.

Out of these sensors, a thin-filmed piezoelectric sensor (compressed type) includes a laminated body in which a pedestal, an electrode on the pedestal, a piezoelectric device, an electrode on a load substance, and the load substance are laminated successively, is used so that a bottom side of the pedestal is firmly installed on a target of measurement. When the target of measurement vibrates, the vibration is conducted to the pedestal of the sensor. The pedestal of the sensor vibrates with the target of measurement, but a vibration of the load substance gets behind due to an inertial power of the load substance, and a compressive stress or a tensile stress is generated in the piezoelectric device in proportion to the vibration acceleration. And an electric charge or voltage in proportion to the stress is generated on both sides of the piezoelectric device, and an electric current flows between the two electrodes located on both sides of the piezoelectric device, and by sensing the amount of the electric current, the amount of a vibration and acceleration of the target of measurement can be sensed.

Usually, this kind of piezoelectric sensors uses a piezoelectric device made of a piezoelectric material such as lead titanate zirconate and polyvinylidene fluoride, but the piezoelectric device made of such a piezoelectric material has low Curie temperature at which polarization vanishes, and maximum temperature at which the device can be used is about 300° C. at most. Therefore, in order to keep a piezoelectric device at suitable temperature, for example, Japanese Laid-Open Patent Publication No. 203665/1993 (Tokukaihei 5-203665) discloses an arrangement for cooling a piezoelectric device by use of a Peltier element. But the function of a Peltier element is limited to generating local temperature gradient, so that the sensor cannot be applied to a place where a cooling device cannot be installed on the outside and temperature rises high on the whole.

Further, in the case of a vibration such as acoustic emission, the vibration may attenuate due to characteristics of a vibration-transmitting material on the way, or an unnecessary vibration may mix from the outside while the vibration is transmitted, and therefore it is desirable to measure the vibration as near as possible to the place where the vibration has been generated. However, as for a structure with its temperature rising high, as shown above, a usual thin-filmed piezoelectric sensor is inferior in heat-resistance, and so the vibration is to be induced to a distant place at low temperature by a vibration-transmitting stick and measured there. But in this case, due to reasons such as attenuation of a vibration or mixture of a noise, the vibration of the target of measurement cannot be measured accurately.

Therefore, in order to make a thin-filmed piezoelectric sensor that has heat-resistance, the use of, for a piezoelectric layer, a piezoelectric material with high Curie temperature such as lithium niobate is disclosed, for example, on Japanese Laid-Open Patent Publication No. 34230/1993 (Tokukaihei 5-34230). The Curie temperature of lithium niobate is about 1140° C. and measurement at high temperature is possible without cooling means. But lithium niobate has several faults; it is difficult to be formed as a thin film, it cannot gain piezoelectric characteristics unless it is single crystal, and it is difficult to be fabricated or processed and costs a lot.

Further, in a case of a thin-filmed vibration sensor for high temperature, disclosed on Japanese Laid-Open Patent Publication No. 122948/1998 (Tokukaihei 10-122948), in order to solve the problems, zinc oxide or aluminum nitride is used as piezoelectric ceramic without Curie temperature, and a thin film made by orientating zinc oxide or aluminum nitride in parallel to a c-axis is used as a piezoelectric device. A thin film made of aluminum nitride or zinc oxide is a hopeful material for downsizing a piezoelectric device.

However, in order to use aluminum nitride or zinc oxide as a piezoelectric device, a thin film in which aluminum nitride or zinc oxide is dipole-orientated is needed, and in order to improve the piezoelectric characteristics of the piezoelectric device, the degree of its dipole-orientation needs to be increased. However, though thin films made of aluminum nitride or zinc oxide have been made in many processes until now, studies on the degree of dipole-orientation of a thin film made of aluminum nitride or zinc oxide have been hardly done, and therefore there is a problem that it is difficult to fabricate a thin film in which the degree of the dipole-orientation is controlled.

Further, the thin film made of aluminum nitride or zinc oxide has a very large internal stress created in a film forming process, and therefore, for example, in the case of forming the thin film on an electrode made on a substrate, there is a problem that a crack appears in the electrode or the thin film peels off from the substrate, accompanied by the electrode.

The present invention is proposed to solve the problem, and its purpose is to provide an efficient piezoelectric device that uses a thin film with a high degree of dipole-orientation and is made of aluminum nitride or zinc oxide, and to provide a method for fabricating the efficient piezoelectric device, with easiness and in a low price.

DISCLOSURE OF INVENTION

In order to solve the problem, the piezoelectric device according to the present invention is a piezoelectric device in which a first electrode layer, a piezoelectric layer and a second electrode layer are laminated on a substrate in this order, the piezoelectric layer being made of aluminum nitride and/or zinc oxide, and a degree of dipole-orientation of said piezoelectric layer being 55% or more.

With the structure, the piezoelectric layer of the piezoelectric device is made of aluminum nitride and/or zinc oxide. Aluminum nitride and zinc oxide with a crystal structure have inborn piezoelectric characteristics because their crystal structures are not symmetrical, they do not have Curie temperature unlike ferroelectrics and never make magnetic transition at high temperature, so that they do not lose piezoelectric characteristics until their crystals melt or sublimate. As a result, the piezoelectric layer made of aluminum nitride and/or zinc oxide has high heat-resistance and its piezoelectric characteristics never deteriorate at high temperature. Further, aluminum nitride and zinc oxide are easily processed and suitable to be thin-filmed, so that the piezoelectric device can be small.

"The above degree of dipole-orientation" is the ratio of plus or minus occupancy that is higher than the other in the dipole-direction of the surface of the piezoelectric device. When the degree of dipole-orientation is 50%, the occupancy of plus and the occupancy of minus become equal, and no signal is sent out, so that it is ideal to be one-sided in either plus or minus. Therefore, making the degree of dipole-orientation of a piezoelectric device 55% or more allows the piezoelectric characteristics of the piezoelectric device to be maintained in a good condition.

Further, in addition to the structure, in the piezoelectric device according to the present invention, the first electrode layer is made of any one of TiN, $MoSi_2$, Cr, Fe, Mg, Mo, Nb, Ta, Ti, Zn, Zr, W, Pt, Al, Ni, Cu, Pd, Rh, Ir, Ru, Au and Ag.

With the structure, forming the first electrode layer made of any one of the above metals allows a thin film of aluminum nitride and/or zinc oxide with a high degree of dipole-orientation to be formed on the first electrode layer. And making the first electrode layer a single layer allows fabrication of a piezoelectric device to be easy.

Further, in addition to the structure, in the piezoelectric device according to the present invention, the first electrode layer has a lamination structure including a contact layer that contacts with the substrate, and at least one conducting layer formed on the contact layer.

With the structure, when the first electrode layer is a single layer without a contact layer, the first electrode layer may peel off from the substrate or a crack may appear on the first electrode layer due to stress, but when the first electrode layer is made a lamination including a contact layer, the peeling off or a crack can be avoided more certainly.

Further, in addition to the structure, in the piezoelectric device according to the present invention, a surface layer of the conducting layer is an oriented metal having a crystal face whose atomic arrangement is identical with an atomic arrangement of (0001) face of aluminum nitride and/or zinc oxide, and in which a distance between atoms is substantially identical with a distance between atoms on (0001) face of aluminum nitride and/or zinc oxide, and the crystal face is parallel to a face of the substrate.

With the structure, when a metal having a crystal face whose atomic arrangement is identical with an atomic arrangement of (0001) face of aluminum nitride and/or zinc oxide, and in which distance between atoms is substantially identical with a distance between atoms on (0001) face of aluminum nitride and/or zinc oxide, is used as the surface layer of the first electrode layer, the crystal of aluminum nitride and/or zinc oxide can grow without warps. As a result, the thin film made of aluminum nitride and/or zinc oxide with a high degree of dipole-orientation can be easily obtained.

Further, in addition to the structure, in the piezoelectric device according to the present invention, the surface layer of the conducting layer is made of a metal whose electronegativity ranges from not less than 1.3 to not more than 1.5.

With the structure, the thin film of aluminum nitride and/or zinc oxide with a high degree of dipole-orientation can be formed on the metal.

Further, in addition to the structure, in the piezoelectric device according to the present invention, the surface layer of the conducting layer is made of any one of TiN, $MoSi_2$, $Si_3N_4$, Cr, Fe, Mg, Mo, Nb, Ta, Ti, Zn, Zr, W, Pt, Al, Ni, Cu, Pd, Rh, Ir, Ru, Au and Ag.

With the structure, by forming the surface layer of the first electrode layer made of any of the above metals, the thin film of aluminum nitride and/or zinc oxide with a high degree of dipole-orientation can be made on the first electrode layer.

Further, in addition to the structure, in the piezoelectric device according to the present invention, the surface layer of the conducting layer is made of any one of an oriented W layer, an oriented Pt layer, an oriented Al layer, an oriented Ni layer, an oriented Cu layer, an oriented Pd layer, an oriented Rh layer, an oriented Ir layer, an oriented Ru layer, an oriented Au layer and an oriented Ag layer, and (111) face of the surface layer is parallel to a face of the substrate.

With the structure, the above oriented metal layers have the same distance between atoms on (0001) face of aluminum nitride and/or zinc oxide, so that crystals of aluminum nitride and/or zinc oxide can grow without warps. As a result, a thin film of aluminum nitride and/or zinc oxide with a high degree of dipole-orientation can be obtained.

Further, in addition to the structure, in the piezoelectric device according to the present invention, the at least one conducting layer are constituted of a first layer made of any one of Ti, Cr or Ta formed on the contact layer, and a second layer made of any of Pt, Au or Ag formed on the first layer.

Further, the at least one conducting layer are constituted of a first layer made of either Ti or Cr formed on the contact layer, a second layer made of either Pt or Ni formed on the first layer, and a third layer made of Au formed on the second layer. Further, in addition to the structure, in the piezoelectric device according to the present invention, the second electrode layer has a lamination structure having a plurality of conducting layers.

Further, in addition to the structure, in the piezoelectric device according to the present invention, the substrate is made of glass, metal, plastic or sintered ceramic.

With the structure, glass, metal, plastic or sintered ceramic is used as the substrate of the piezoelectric device. They cost lower than a single crystal substrate and are easy to obtain, so that the cost of the piezoelectric device can be reduced. Further, for example, when silica glass is used as glass and stainless is used as metal in the substrate, the thin film of aluminum nitride and/or zinc oxide with a higher degree of dipole-orientation than other materials can be obtained.

Further, in addition to the structure, in the piezoelectric device according to the present invention, the substrate is made of metal or plastic whose thickness ranges from 5 to 100 μm.

Further, in order to solve the problem, a method according to the present invention for fabricating a piezoelectric device comprises the steps of: (i) forming a first electrode layer on a substrate; (ii) forming a piezoelectric layer on the first electrode layer; and (iii) forming a second electrode layer on the piezoelectric layer, in the step (ii), the piezoelectric layer being made of aluminum nitride and/or zinc oxide, and whose degree of dipole-orientation is 55% or more.

With the structure, the piezoelectric layer is formed so that the degree of the dipole-orientation of aluminum nitride and/ or zinc oxide is 55% or more. As a result, the piezoelectric device with heat-resistance and good piezoelectric effect can be fabricated.

Further, in addition to the structure, in the method according to the present invention for fabricating a piezoelectric device, the step (i) includes sub-steps of: (I) forming a contact layer that closely contacts with the substrate, and (II) forming at least one conducting layer on the contact layer.

With the structure, a stable piezoelectric device without peeling off of a first electrode layer from the substrate and without a crack of the first electrode layer can be obtained.

Further, in addition to the structure, in the method according to the present invention for fabricating a piezoelectric device, in the step (i), a film is fabricated by metal at a temperature ranging from not less than room temperature to not more than 150° C.

With the structure, formation of gaps between metal particles that form the first electrode layer can be avoided. As a result, the first electrode layer suitable for dipole-orienting a thin film of aluminum nitride and/or zinc oxide can be fabricated. Further, a difference in thermal expansion between the substrate and the first electrode layer vanishes and accordingly the stress decreases, so that a problem that a crack or peeling off may occur in the first electrode layer can be avoided. Further, short circuit between the first electrode layer and the second layer can be avoided.

Further, in addition to the structure, in the method according to the present invention for fabricating a piezoelectric device, the step (i) is carried out through a physical vapor deposition process.

With the structure, the first electrode layer is formed easily. "Physical vapor deposition process" is a process in which a matter is evaporated through physical means, solidified on a part for film formation, and made into a thin film. The process points mainly to a sputtering process, an ion plating process and a vacuum deposition process. Further, with the structure, needle-like shaped crystal pillars of a piezoelectric material grow like frost in the ground, so that the piezoelectric material can form a thin film in a single crystal condition.

BEST MODE FOR CARRYING OUT THE INVENTION

First Embodiment

Figure 1:
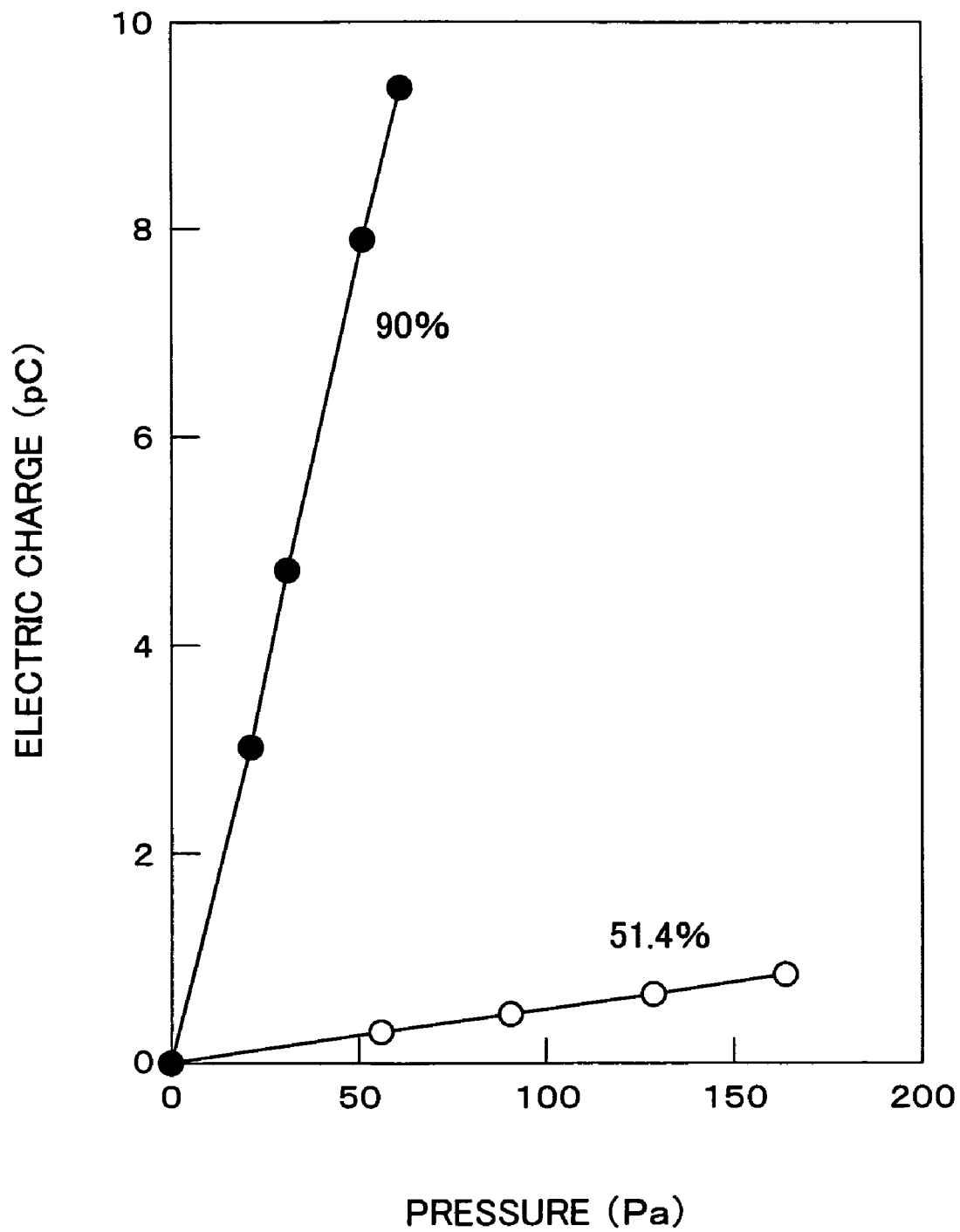
FIG. 1 illustrates a relation between a pressure applied to a piezoelectric device and an electric charge reserved in the piezoelectric device.

First embodiment of the present invention is explained below.

A piezoelectric device according to the present embodiment includes a lamination structure having a lower electrode (a first electrode layer), a piezoelectric thin film (a piezoelectric layer) and an upper electrode (a second electrode layer) successively on a substrate. Because the piezoelectric device according to the present embodiment is a piezoelectric device in which the piezoelectric thin film is formed on the substrate, it can be used as a pressure sensor, a vibration sensor, an acceleration sensor, a surface elastic wave filter, or the like, and besides it can be made highly sensitive.

As for the substrate, it is possible to use not only a single crystal substrate made of single crystal such as sapphire or silicon, but also a substrate other than a single crystal substrate, such as a glass substrate, a polycrystalline ceramic substrate, a metal substrate or a resin substrate. As mentioned later, as for the piezoelectric thin film of the piezoelectric device of the present embodiment, it is possible to form a thin film of aluminum nitride and/or zinc oxide that is dipole-orientated on a substrate other than a single crystal substrate, so that in this case, it is possible to fabricate a piezoelectric device in a lower price than a case of using a single crystal substrate.

It is desirable that electronegativity of a metal forming the lower electrode ranges from 1.3 to 1.5, and more desirable that it is near 1.4. The lower electrode contacts with the piezoelectric thin film, and the piezoelectric thin film is made of the later-mentioned aluminum nitride and/or zinc oxide. When the lower electrode is made of a metal whose electronegativity is out of the aforesaid range, the degree of dipole-orientation of the thin film made of aluminum nitride and/or zinc oxide on the lower electrode gets reduced severely, but when the lower electrode is made of a metal whose electronegativity is within the aforesaid range, it becomes possible to form the thin film made of aluminum nitride and/or zinc oxide with a high degree of dipole-orientation. Further, it is more desirable that a metal for forming the lower electrode has a crystal face whose atomic arrangement is the same as that of (0001) face of aluminum nitride and/or zinc oxide that forms the piezoelectric thin film, and whose distance between atoms is substantially the same as that of (0001) face of aluminum nitride and/or zinc oxide that forms the piezoelectric thin film. This is because, there is no difference in a lattice constant between a crystal face of such a metal and (0001) face of aluminum nitride and/or zinc oxide that forms the piezoelectric thin film, so that aluminum nitride and zinc oxide can grow without warps when the piezoelectric thin film is formed, and accordingly the thin film made of aluminum nitride and/or zinc oxide with a high degree of dipole-orientation can be formed.

Further, it is more desirable that the metal for forming the lower electrode has a crystal face being parallel to the substrate, and is orientational. For example, the lower electrode can be made of any one of TiN, $MoSi_2$, Cr, Fe, Mg, Mo, Nb, Ta, Ti, Zn, Zr, W, Pt, Al, Ni, Cu, Pd, Rh, Ir, Ru, Au and Ag. Note that there is no difference in a lattice constant between (111) face of W, Pt, Al, Ni, Cu, Pd, Rh, Ir, Ru, Au or Ag, and (0001) face of aluminum nitride or zinc oxide. Therefore, it is more desirable to make the lower electrode out of any one of an oriented W layer, an oriented Pt layer, an oriented Al layer, an oriented Ni layer, an oriented Cu layer, an oriented Pd layer, an oriented Rh layer, an oriented Ir layer, an oriented Ru layer, an oriented Au layer and an oriented Ag layer, (111) face of W, Pt, Al, Ni, Cu, Pd, Rh, Ir, Ru, Au or Ag being parallel to a face of the substrate. These metal layers obtain the orientations by orientational crystal growth under circumstances controlled by film-forming condition.

The piezoelectric thin film is formed by dipole-oriented aluminum nitride and/or dipole-oriented zinc oxide, the degree of dipole-orientation being 55% or more. Namely, the piezoelectric thin film is formed by either dipole-oriented aluminum nitride or dipole-oriented zinc oxide, or by both, and is formed so that the degree of their dipole-orientation is 55% or more. Here, the degree of dipole-orientation is the ratio of plus or minus occupancy that is higher than the other in the dipole direction on the surface of the piezoelectric thin film. In the case of the degree of dipole-orientation being 50%, the occupancy of plus and the occupancy of minus become equal and no signal is sent out, and therefore it is ideal to be one-sided in either plus or minus.

FIG. 1 illustrates a relation between a pressure applied to a piezoelectric device and an electric charge reserved in the piezoelectric device, and as illustrated in the figure, the higher pressure is applied to the piezoelectric device, the larger amount of an electric charge is reserved in the piezoelectric device. In FIG. 1, the degree of dipole-orientation of the piezoelectric device being a parameter, the amounts of electric charges in cases where the degrees of dipole-orientation are 51.4% and 90% are measured, and the figure tells that there is a correlation between the degree of dipole-orientation and the amount of an electric charge reserved in the piezoelectric device. Namely, the higher the degree of dipole-orientation is, the higher voltage the piezoelectric device can reserve and as a result the more efficient the piezoelectric device becomes. Note that, in theory, when there is a little difference between plus and minus, namely, when the degree of dipole-orientation is, for example, 50.1%, a signal is sent out, but the result of measurement of whether a signal is sent out or not according to the degree of dipole-orientation shows that when the degree is not more than 55%, the signal is difficult to be measured, so that a thin film whose degree of dipole-orientation is 55% or more is used as a piezoelectric thin film.

The upper electrode can be made of a metal such as Al, Pt, Au, Ag and Cu, an alloy being made mainly of these metals, a conductive oxide such as ITO, iridium dioxide, ruthenium dioxide, rhenium trioxide and LSCO ($La_{0.5}Sr_{0.5}CoO_3$), or nitride such as silicon nitride. Note that, in addition to the above materials, a conductive material that contacts well with the thin film made of aluminum nitride and/or zinc oxide, and in which stress is hardly generated, also can be used.

Next, one example of the method for fabricating a piezoelectric device is explained. Note that in the present embodiment, as an example, a piezoelectric device including a piezoelectric thin film made of aluminum nitride thin film is explained. However, the present invention is not limited to this example, the same manner is also applied to a piezoelectric device including as a piezoelectric thin film a zinc oxide thin film or a thin film made of both aluminum nitride and zinc oxide.

As described above, it is possible to select a variety of substrates such as a single crystal substrate, a polycrystalline substrate and an amorphous substrate. The thin film made of dipole-oriented aluminum nitride and/or dipole-oriented zinc oxide can be formed regardless of the kind of a substrate, so that the present embodiment uses the polycrystalline substrate or the amorphous substrate. This is because the polycrystalline substrate or the amorphous substrate is lower in a price than the single crystal substrate and is easy to obtain. Concretely, it is more desirable to select a glass substrate or a metal substrate, particularly a silica glass substrate or a stainless substrate. The silica glass substrate or the stainless substrate can obtain a higher degree of dipole-orientation than other materials, so that it is suitable for the substrate of the piezoelectric device. Note that besides the silica glass substrate or the stainless substrate, a metal or a plastic whose thickness ranges from 5 to 100 μm may be used.

Then, a first electrode layer forming process is carried out, by which a lower electrode is formed on the substrate. Because the lower electrode uses a conductor as a material for an electrode, the lower electrode is formed by evaporating a predetermined metal or alloy through PVD (Physical Vapor Deposition). As a physical vapor deposition, the following processes of film formation can be used: a vacuum deposition such as a resistance heating deposition or an electron beam heating deposition; a variety of sputtering processes such as direct current sputtering, high frequency sputtering, RF plasma sputtering, magnetron sputtering, ECR sputtering or ion beam sputtering; a variety of ion plating processes such as high frequency ion plating, activated deposition or arc ion plating; molecular beam epitaxy; laser ablation; ionized cluster beam deposition; and ion beam deposition. Out of these processes, it is desirable to use a sputtering process, particularly an RF plasma sputtering. This is because, when the RF plasma sputtering is carried out, sputtering under a relatively high degree of vacuum can be realized, so that it becomes possible to form the lower electrode of better quality made of the thin film of aluminum nitride and/or zinc oxide. However, the deposition process can be suitably selected according to what kind of material to be evaporated.

Further, it is more desirable to make the thin-filmed lower electrode at temperature ranging from not less than room temperature (25° C.) to not more than 150° C. By making the lower electrode at the aforesaid temperature, it becomes possible to prevent the formation of gaps between metal particles that form the lower electrode. As a result, it becomes possible to further restrain the generation of a crack, a hillock and peeling off, and to further restrain short circuit between the upper electrode and the lower electrode.

Note that when the temperature at which the film formation of the lower electrode is carried out is higher than the temperature at which gaps are formed between particles, metal particles may increase in size in film formation, making the microstructure of the lower electrode smooth. When the microstructure of the lower electrode is made smooth, a risk of short circuit between the upper electrode and the lower electrode decreases. Therefore, the film formation of the lower electrode is possible when the temperature is higher than a temperature at which gaps are formed between particles, and at which the gaps between the particles are eliminated on account of the increase in size and the microstructure of the electrode is made smooth.

The conditions of film formation are set so that, for example, pressure is $1.0 \times 10^{-1}$ Pa, partial pressure ratio of nitrogen gas is 0%, temperature of the substrate is in a non-heated state, and an electric power applied to a target is 200 W. Further, a thickness of a film to be formed can be varied according to a material. However, the conditions can be changed suitably.

Then, by using the aforesaid conditions of film formation and the vapor deposition, the lower electrode is formed, that matches well with (0001) face of later formed aluminum nitride. The lower electrode can be made by film formation through sputtering, of an oriented W layer, an oriented Pt layer, an oriented Al layer, an oriented Ni layer, an oriented Cu layer, an oriented Pd layer, an oriented Rh layer, an oriented Ir layer, an oriented Ru layer, an oriented Au layer or an oriented Ag layer, (111) face of W, Pt, Al, Ni, Cu, Pd, Rh, Ir, Ru, or Ag being parallel to the face of the substrate.

Forming the film at temperature of the above range, the lower electrode suitable for making a thin film of dipole-oriented aluminum nitride is formed. Further, because there is no difference in thermal expansion between the substrate and the lower electrode, the stress of the lower electrode can be reduced, and therefore a crack or a hillock of the lower electrode, or peeling off of the lower electrode can be avoided.

Next, a piezoelectric layer forming process is carried out, by which a piezoelectric thin film is formed on the lower electrode. A piezoelectric thin film that is made of an aluminum nitride thin film whose degree of dipole-orientation is 55% or more is formed on the lower electrode. It is more desirable that the formation of the piezoelectric thin film is carried out through a PVD process, particularly a sputtering process. It is more desirable that, as described above, a metal that forms the lower electrode has a crystal face whose atomic arrangement is the same as that of (0001) face of aluminum nitride, and whose distance between atoms is substantially the same as that of (0001) face of aluminum nitride, and the crystal face is parallel in orientation to the substrate. The crystal face of such a metal forms the same underlying surface as a single crystal such as sapphire, and therefore a thin film is formed on the lower electrode with aluminum or aluminum nitride being a target of PVD process, so that a piezoelectric thin film made of dipole-oriented aluminum nitride can be obtained.

The sputtering can be carried out by, for example, a high frequency wave magnetron sputtering device. In this case, vacuuming is carried out in a sputtering chamber so that pressure becomes $5 \times 10^{-4}$ Pa or lower, and argon gas of high purity (purity 99.999%) and, nitrogen gas of high purity (purity 99.999%) or oxygen gas of high purity (purity 99.999%) are introduced. Before carrying out a vapor deposition, pre-sputtering of aluminum or aluminum nitride as a target is carried out for ten minutes, while a shutter of a high frequency magnetron sputtering device is closed. And an aluminum nitride thin film is formed by carrying out sputtering under the film forming conditions that, for example, sputtering pressure is 0.5 Pa, temperature of the substrate is 300° C., partial pressure ratio of nitrogen gas is 50%, an electric power applied to a target is 300 W, sputtering time is 4 hours.

Further, the above film forming conditions can be varied accordingly and, for example, in a case of forming an aluminum nitride thin film whose thickness is 2000 nm, the conditions are set as follows: sputtering pressure is $1.3 \times 10^{-1}$ Pa, partial pressure ratio of nitrogen gas is 60%, temperature of the substrate is 300° C., an electric power applied to a target is 200 W, and sputtering time is 12 hours.

Next, a second electrode forming process is carried out, by which an upper electrode is formed on the piezoelectric thin film. Through vapor deposition such as PVD or CVD (Chemical Vapor Deposition), the upper electrode made of any one of the materials for the aforesaid upper electrode is formed. Further, it is possible to form an upper electrode having a lamination structure using a plurality of the materials for the upper electrode. Note that the vapor deposition and forming conditions for the formation of the upper electrode can be varied according to a material to be evaporated.

With the above process, it is possible to fabricate a piezoelectric device in which a lower electrode, a piezoelectric electrode made of dipole-oriented aluminum nitride, and an upper electrode are formed on a substrate other than a single crystal substrate. Further, by forming a piezoelectric thin film in consideration of orientation, face arrangement and atomic arrangement relative to the lower electrode, it is possible to fabricate a piezoelectric device in which the degree of dipole-orientation is high and the generation of stress that is the cause of peeling off, a crack and a hillock is restrained.

Second Embodiment

Second embodiment of the present invention is explained below.

A piezoelectric device of the present embodiment has a lower electrode that is a laminated body including a contact layer for contacting closely with a substrate, and an electrode layer (a conducting layer) as an electrode. As for other structures, they are the same as the piezoelectric device explained in the first embodiment.

A surface layer of the lower electrode, that is a laminated body, contacts with a piezoelectric thin film. Aluminum nitride and/or zinc oxide that forms the piezoelectric thin film can, just like the first embodiment, have a high degree of dipole-orientation on a metal whose electronegativity ranges, for example, from 1.3 to 1.5, and therefore it is more desirable that a metal that forms the surface layer of the lower electrode is a metal whose electronegativity ranges from 1.3 to 1.5. Further, it is more desirable that the metal that forms the surface layer of the lower electrode has a crystal face whose atomic arrangement is the same as that of (0001) face of aluminum nitride and/or zinc oxide, and whose distance between atoms is substantially the same as that of aluminum nitride and/or zinc oxide. This is because, there is no difference in a lattice constant between the crystal face of such a metal and (0001) face of aluminum nitride and/or zinc oxide that forms the piezoelectric thin film, so that, in forming the piezoelectric thin film, the crystal of aluminum nitride or zinc oxide can grow without warps, and the thin film of aluminum nitride and/or zinc oxide with a high degree of dipole-orientation can be formed.

Further, it is more desirable that the surface layer of the lower electrode is made of an oriented metal whose crystal face is parallel to the substrate. For example, the surface layer can be made of any one of TiN, $MoSi_2$, $Si_3N_4$, Cr, Fe, Mg, Mo, Nb, Ta, Ti, Zn, Zr, W, Pt, Al, Ni, Cu, Pd, Rh, Ir, Ru, Au and Ag. Note that there is no difference in a lattice constant between (111) face of W, Pt, Al, Ni, Cu, Pd, Rh, Ir, Ru, Au or Ag and (0001) face of aluminum nitride and zinc oxide. Therefore, it is more desirable that the surface layer is made of any one of an oriented W layer, an oriented Pt layer, an oriented Al layer, an oriented Ni layer, an oriented Cu layer, an oriented Pd layer, an oriented Rh layer, an oriented Ir layer, an oriented Ru layer, an oriented Au layer and an oriented Ag layer, (111) face of W, Pt, Al, Ni, Cu, Pd, Rh, Ir, Ru, Au or Ag being parallel to a face of the substrate.

Further, when the lower electrode is a laminated body having two layers, it can be formed as a two-layered body in which a first layer formed on a substrate is made of Ti or Cr, and a second layer formed on the first layer is made of Pt. (Hereinafter, these layers are described as a first layer formed on a substrate/a second layer formed on the first layer. Namely, in the above case, it is Ti/Pt or Cr/Pt. The same manner is applied to a three-layered laminated body). Further, when the lower electrode is a three-layered laminated body, it is formed as Ti/Pt/Au, Ti/Ni/Au or Cr/Ni/Au.

Note that in a case where the lower electrode is formed as a single layer that has no contact layer like the first embodiment, for example, when the lower electrode is made of Pt, Au, Ru or Ag as a single layer on the substrate, stress may be generated. As a result, there is a possibility that the lower electrode may be peeled off from the substrate or a crack may be found in the lower electrode. However, making the lower electrode a laminated body having a contact layer restrains the peeling and the generation of a crack.

Next, one example of a fabrication method of a piezoelectric device is explained. Note that in the present embodiment, as an example, a piezoelectric device including a piezoelectric thin film made of an aluminum nitride thin film is explained. However, the present invention is not limited to this example, and the same manner can be applied to a piezoelectric device that includes as a piezoelectric thin film a zinc oxide thin film or a thin film made of aluminum nitride and zinc oxide.

As with the first embodiment, by using a silica glass substrate or a stainless substrate as a substrate, a first electrode forming process is carried out, by which a lower electrode is formed on a substrate. As the first electrode forming process, first of all, a contact layer forming process is carried out, by which a contact layer is formed on the substrate. Then, a conducting layer forming process is carried out, by which an electrode layer is formed on the contact layer. The contact layer and the electrode layer are formed under the same condition of film formation and through the same process of vapor deposition as the first embodiment, and thereby the lower electrode is formed.

And the electrode layer is formed, that matches well with (0001) face of aluminum nitride that is a later formed piezoelectric thin film. It is more desirable that the surface layer of the electrode layer, namely, the layer that contacts with the piezoelectric thin film, is made of any one of TiN, $MoSi_2$, $Si_3N_4$, Cr, Fe, Mg, Mo, Nb, Ta, Ti, Zn, Zr, W, Pt, Al, Ni, Cu, Pd, Rh, Ir, Ru, Au and Ag.

Further, the surface layer of the electrode layer may be made of an oriented W layer, an oriented Pt layer, an oriented Al layer, an oriented Ni layer, an oriented Cu layer, an oriented Pd layer, an oriented Rh layer, an oriented Ir layer, an oriented Ru layer, an oriented Au layer or an oriented Ag layer, (111) face of W, Pt, Al, Ni, Cu, Pd, Rh, Ir, Ru, Au or Ag being parallel to a face of the substrate.

By forming the lower electrode as a thin film at temperature ranging from not less than room temperature (25° C.) to not more than 150° C., the lower electrode suitable for forming a thin film of dipole-oriented aluminum nitride can be formed. Further, because there is no difference in thermal expansion among the substrate, the contact layer and the lower electrode, the stress of the lower electrode can be reduced, and therefore generation of a crack or a hillock in the lower electrode and peeling off of the lower electrode from the substrate can be avoided.

Next, a piezoelectric layer forming process is carried out, by which a piezoelectric thin film is formed on the lower electrode. On the lower electrode, a piezoelectric thin film made of an aluminum nitride thin film whose degree of dipole-orientation being 55% or more is formed. It is more desirable that the formation of the piezoelectric thin film is carried out, just like the first embodiment, through a PVD process, particularly a sputtering process. Further, it is more desirable that a metal that forms the surface layer of the lower electrode has a crystal face whose atomic arrangement is the same as that of (0001) face of aluminum nitride, and whose distance between atoms is substantially the same as that of (0001) face of aluminum nitride, and the crystal face is parallel in orientation to the substrate. Because such a metal has a crystal face that forms the same underlying surface as that of a single crystal such as sapphire, and therefore a thin film is formed on the surface layer of the lower electrode with aluminum or aluminum nitride being a target of the PVD process, so that the piezoelectric thin film made of dipole-oriented aluminum nitride can be obtained. Further, the aluminum nitride thin film can be formed under the same condition as the first embodiment.

Next, a second electrode layer forming process is carried out, by which an upper electrode is formed on the piezoelectric thin film. The upper electrode is made of any one of the materials for the upper electrode through the PVD process or CVD process. Further, it is possible that the upper electrode having a lamination structure is made of a plurality of the materials for the upper electrode. Note that the vapor deposition and condition of formation for forming the upper electrode can be varied according to materials to be evaporated.

With the above process, it is possible to fabricate a piezoelectric device including a lower electrode that has a contact layer on a substrate other than a single crystal substrate, a piezoelectric layer that is made of a thin film of dipole-oriented aluminum nitride, and an upper electrode. Further, by forming a piezoelectric thin film in consideration of orientation, face arrangement and atomic arrangement relative to the lower electrode, it is possible to fabricate the piezoelectric device in which the degree of dipole-orientation is high and the generation of stress that is the cause of peeling off, a crack and a hillock is restrained.

EXAMPLES

It is known that electric characteristics of a piezoelectric device, such as an electromechanical coupling coefficient, greatly depend on the degree of dipole-orientation of a piezoelectric thin film. Therefore, in order to provide a piezoelectric device with a piezoelectric thin film that has a higher degree of dipole-orientation, the influence of a lower electrode on the formation of a piezoelectric thin film, and the effect of making a lower electrode a laminated body in the formation of a piezoelectric thin film, were examined. The details are explained below.

(The Influence of a Lower Electrode)

Examples of past main studies in which an aluminum nitride thin film was formed on a conductor, are as follows; a study for increasing corrosion-resistance of iron, and a study in which an aluminum nitride thin film was formed on an aluminum electrode for an SAW (surface acoustic wave) filter. Studies in which an aluminum nitride thin film was formed on other kinds of conductors are rare, and the only example is an aluminum nitride thin film formed on a Au thin film on a glass substrate. Therefore, in order to form an aluminum nitride thin film having a high degree of dipole-orientation on a lower electrode, twenty kinds of lower electrodes were formed as thin films by use of twenty kinds of conductors and an aluminum nitride thin film was formed on each lower electrode, so that the influence of a lower electrode on the degree of dipole-orientation of an aluminum nitride thin film was examined. Note that twenty kinds of lower electrodes were formed mainly by a sputtering process at room temperature, and a glass substrate was used as a substrate.

Concretely, a silica glass substrate whose size is 20 mm×20 mm×1.1 mm was used as a substrate, and lower electrodes were formed as thin films on the silica glass substrates. The conditions of film formation of the lower electrodes were such that pressure was $1.0 \times 10^{-1}$ Pa, partial pressure ratio of nitrogen gas was 0%, temperature of substrates was in non-heated state, and an electric power applied to a target was 200 W. Further, the thickness of a film of the lower electrode was varied according to materials. Then, the aluminum nitride thin film was formed on each of the lower electrodes. The conditions of film formation of aluminum nitride thin films were such that pressure was $1.3 \times 10^{-1}$ Pa, partial pressure ratio of nitrogen gas was 60%, temperature of the substrates was 300° C., an electric power applied to a target was 200 W, and the thickness of a film was 2000 nm.

Note that if materials that are often used as semiconductors, for example, such materials as Al—Si, Ni and Cr, can be used as lower electrodes, it becomes easy to integrate a semiconductor with a piezoelectric device including a thin film made of aluminum nitride and/or zinc oxide. However, in cases of these materials, it was impossible to increase the degree of dipole-orientation of the thin film made of aluminum nitride and/or zinc oxide, and besides a lot of cracks were generated. Further, when Pt, Au or Ru was formed as a lower electrode, directly on a silica glass substrate, the lower electrode did not contact well with the silica glass substrate, and the lower electrode was peeled off from the silica glass substrate. Therefore, a contact layer made of metal such as Ti or Cr was formed on the silica glass substrate. And when a TiN thin film was formed as a surface layer of a lower electrode and an aluminum nitride thin film was formed on the TiN thin film, an aluminum nitride thin film with a super high degree of dipole-orientation (the degree was 90%) and with a high degree of crystallization was obtained. Note that an example of successfully forming an aluminum nitride thin film on a TiN thin film has not been reported so far. Further, when an aluminum nitride thin film was formed on W, Ti/Pt, Ti/Au and Ti/Ag that were surface layers of lower electrodes, the aluminum nitride thin film with a super high degree of dipole-orientation (the degree was about 90%) was obtained, too.

Next, when the crystal structure of the aluminum nitride thin film that was formed through the above process is excellent partially (in micro level) but cracks and peeling off are generated wholly (in macro level), it is difficult to mass-fabricate piezoelectric devices. Therefore, observation of the surface of each aluminum nitride thin film was carried out with an optical microscope. On the surface of the aluminum nitride thin film formed on TiN, hillocks were observed, but no crack or peeling off was observed. Further, the surfaces of the aluminum nitride thin films formed on W and Ti/Pt were smooth and even, and no crack or peeling off was observed.

On the other hand, on the surface of the aluminum nitride thin film formed on Ti/Au or Ti/Ag, hillocks and large cracks were observed. Further, as described above, though using an Al—Si thin film allows the use of the existing semiconductor technologies, it was impossible to form, on the Al—Si thin film, an aluminum nitride thin film with a high degree of dipole-orientation, and besides serious cracks were observed. Further, on the surface of the aluminum nitride thin film formed on the thin film made of Cr or Ni, numerous cracks were generated, and some parts were like pin holes.

From the above results, it was found that the aluminum nitride thin film formed on W and Ti/Pt has a high degree of dipole-orientation and a high degree of crystallization, and no hillock, crack or peeling off was observed on the film. Therefore, it was found that the thin film made of W or Ti/Pt is excellent as the thin film forming the surface of the lower electrode.

(The Effect of Making a Lower Electrode a Laminated Body)

There has been no report so far about the effect of causing a lower electrode of a piezoelectric device including a piezoelectric thin film made of an aluminum nitride thin film to be laminated. Therefore, it was examined that, when two or three metal thin films were laminated to form a lower electrode, and an aluminum nitride thin film was formed on the lower electrode, what kind of effect is exerted on a crystal structure of the aluminum nitride thin film, such as the degree of dipole-orientation and the degree of crystallization.

First, as one of the above examination (of the influence of a lower electrode), a Pt family such as Ti/Pt or Cr/Pt has a high degree of dipole-orientation and a high degree of crystallization, and therefore a lower electrode with a lamination structure in which the Pt family was formed as a surface layer, was examined. A silica glass substrate whose size was 20 mm×20 mm×1.1 mm was used, and the conditions of film formation of the lower electrode were such that pressure was $1.0 \times 10^{-1}$ Pa, partial pressure ratio of nitrogen gas was 0%, temperature of the substrate was non-heated state, an electric power applied to a target was 200 W, and the thickness of the film was varied according to materials. Further, the conditions of film formation of the aluminum nitride thin film were such that pressure was $1.3 \times 10^{-1}$ Pa, partial pressure ratio of nitrogen gas was 60%, temperature of the substrate was 300° C., an electric power applied to a target was 200 W, and the thickness of the film was 2000 nm.

By changing the layer of the lower electrode on the substrate side from Ti to Cr, the degree of dipole-orientation of the aluminum nitride thin film that was formed above increased from 90% to 95%. Further, the maximum integral intensity of (002) face of the aluminum nitride thin film increased about twice. As a result, it was found that though a Cr thin film had a thickness of only several tens of nm, it had a large influence on the degree of dipole-orientation and the degree of crystallization of the aluminum nitride thin film formed on the Cr thin film.

Next, a lower electrode with a lamination structure in which a Au family such as Ti/Au, Ti/Pt/Au, Ti/Ni/Au or Cr/Ni/Au was formed as a surface layer, was examined. As a result, the degree of dipole-orientation of each thin film was almost 90% or more, and there was not seen much differences between the layers. Further, there was not seen much differences in maximum integral intensity between (002) faces of the aluminum nitride thin films that were formed above. Therefore, when a thin film of the Au family was used as the surface layer, unlike when a thin film of the Pt family was used as the surface layer, the influences of the lamination effect of the lower electrode on the degree of dipole-orientation and crystallization of the aluminum nitride thin film were not observed.

In the above (the influence of a lower electrode) and (the effect of making a lower electrode a laminated body), in order to obtain an aluminum nitride thin film with a high degree of dipole-orientation, the influence of a lower electrode and the effect of making a lower electrode a laminated body in a case where an aluminum nitride thin film was formed, were examined. As a result, it was found that the degrees of dipole-orientation, crystallization and the like of an aluminum nitride thin film formed on a lower electrode vary greatly, according to the kind of metals used in the lower electrode and to the lamination structure of the lower electrode. Namely, from the examination of the influence of a lower electrode, it was found that when an aluminum nitride thin film is formed on a lower electrode that is made of TiN, W, Ti/Au, Ti/Ag and Ti/Pt, an aluminum nitride thin film with a high degree of dipole-orientation was obtained. However, it was found that an aluminum nitride thin film formed on a lower electrode made of TiN, Ti/Au and Ti/Ag has a hillock and a large crack on its surface and therefore TiN, Ti/Au and Ti/Ag are not suitable for materials of a lower electrode. On the other hand, it was found that an aluminum nitride thin film formed on a lower electrode made of W and Ti/Pt has an even surface almost without a crack and peeling off, and therefore W and Ti/Pt are suitable for materials of a lower electrode. Further, it was found that the higher the degrees of dipole-orientation and crystallization of a film-formed lower electrode are, the higher the degrees of dipole-orientation and crystallization of an aluminum nitride thin film formed on the lower electrode are. Further, it was found that as a material used for a surface layer of a lower electrode, a metal whose electronegativity ranges from 1.3 to 1.5 is suitable.

Further, the present invention can provide an efficient piezoelectric device having a high degree of dipole-orientation, though it uses an inexpensive substrate such as a glass substrate. Further, the piezoelectric device of the present invention is high quality and high performance, without a hillock, a crack or peeling off, in addition to being efficient. As shown above, the present invention is advantageous in that, by using an inexpensive substrate such as a glass substrate, a metal substrate, a plastic substrate, or a sintered ceramic substrate, it can provide a piezoelectric device of high quality and high performance, that has a piezoelectric thin film made of aluminum nitride and/or zinc oxide. Further, in addition to the case where a lower electrode is a single layer made of a metal such as W, when a lower electrode is made a laminated body with a contact layer, the present invention can provide a more efficient piezoelectric device of higher quality, by selecting a suitable material for a surface layer of the lower electrode. Further, the present invention can provide a fabrication method of an efficient piezoelectric device of high quality, without a hillock, a crack or peeling off, by controlling a particle shape of a material used for a lower electrode and by using physical vapor deposition such as RF sputtering process when a lower electrode is formed as a thin film.

Note that the conditions of producing a piezoelectric device in the first embodiment, the second embodiment and the examples are merely examples, and the present invention is not limited to the numeral values shown in the conditions.

INDUSTRIAL APPLICABILITY

In the piezoelectric device of the present invention, the piezoelectric layer is made of aluminum nitride and/or zinc oxide, and has an inborn piezoelectric effect because its crystal structure is not symmetrical, and the piezoelectric device of the present invention does not have Curie temperature unlike ferroelectrics, and in the device, magnetic transition does not occur even at high temperature, so that the piezoelectric layer never loses piezoelectric effect until crystal melts or sublimates. Therefore, the piezoelectric layer made of aluminum nitride and/or zinc oxide is excellent in heat-resistance and its piezoelectric effect never deteriorates even at high temperature.

The piezoelectric device of the present invention makes it possible to set a sensor in a structure that generates atmosphere of high temperature, such as a conduit and a valve in a plant like a nuclear power plant, or an internal combustion engine in order to detect abnormality of the structure.

The invention claimed is:

1. A piezoelectric device in which a first electrode layer, a piezoelectric layer and a second electrode layer are laminated on a substrate in this order,
    said piezoelectric layer being made of aluminum nitride and/or zinc oxide, and a degree of dipole-orientation of said piezoelectric layer being 55% or more.

2. The piezoelectric device as set forth in claim 1, wherein said first electrode layer is made of any one of TiN, $MoSi_2$, Cr, Fe, Mg, Mo, Nb, Ta, Ti, Zn, Zr, W, Pt, Al, Ni, Cu, Pd, Rh, Ir, Ru, Au and Ag.

3. The piezoelectric device as set forth in claim 1, wherein the first electrode layer has a lamination structure comprising a contact layer that contacts with the substrate, and at least one conducting layer formed on the contact layer.

4. The piezoelectric device as set forth in claim 3, wherein a surface layer of the conducting layer is an oriented metal having a crystal face whose atomic arrangement is identical with an atomic arrangement of (0001) face of aluminum nitride and/or zinc oxide, and in which a distance between atoms is substantially identical with a distance between atoms on (0001) face of aluminum nitride and/or zinc oxide, and the crystal face is parallel to a face of the substrate.

5. The piezoelectric device as set forth in claim 3, wherein the surface layer of the conducting layer is made of a metal whose electronegativity ranges from not less than 1.3 to not more than 1.5.

6. The piezoelectric device as set forth in claim 3, wherein the surface layer of the conducting layer is made of any one of TiN, $MoSi_2$, $Si_3N_4$, Cr, Fe, Mg, Mo, Nb, Ta, Ti, Zn, Zr, W, Pt, Al, Ni, Cu, Pd, Rh, Ir, Ru, Au and Ag.

7. The piezoelectric device as set forth in claim 3, wherein the surface layer of the conducting layer is made of any one of an oriented W layer, an oriented Pt layer, an oriented Al layer, an oriented Ni layer, an oriented Cu layer, an oriented Pd layer, an oriented Rh layer, an oriented Ir layer, an oriented Ru layer, an oriented Au layer and an oriented Ag layer, and (111) face of the surface layer is parallel to the face of the substrate.

8. The piezoelectric device as set forth in claim 3, wherein said at least one conducting layer are constituted of a first layer made of any one of Ti, Cr and Ta formed on the contact layer, and a second layer made of any of Pt, Au and Ag formed on the first layer.

9. The piezoelectric device as set forth in claim 3, wherein said at least one conducting layer are constituted of a first layer made of either Ti or Cr formed on the contact layer, a second layer made of either Pt or Ni formed on the first layer, and a third layer made of Au formed on the second layer.

10. The piezoelectric device as set forth in claim 1, wherein the second electrode layer has a lamination structure having a plurality of conducting layers.

11. The piezoelectric device as set forth in claim 1, wherein the substrate is made of glass, metal, plastic or sintered ceramic.

12. The piezoelectric device as set forth in claim 1, wherein the substrate is made of metal or plastic whose thickness ranges from 5 to 100 μm.

13. A method for fabricating a piezoelectric device, comprising the steps of:
    (i) forming a first electrode layer on a substrate;
    (ii) forming a piezoelectric layer on the first electrode layer; and
    (iii) forming a second electrode layer on the piezoelectric layer,
    in the step (ii), the piezoelectric layer being made of aluminum nitride and/or zinc oxide, and whose degree of dipole-orientation is 55% or more.

14. The method for fabricating a piezoelectric device as set forth in claim 13, wherein the step (i) includes sub-steps of:
    (I) forming a contact layer that closely contacts with the substrate, and
    (II) forming at least one conducting layer on the contact layer.

15. The method for fabricating a piezoelectric device as set forth in claim 13, wherein, in the step (i), a film is fabricated by metal at a temperature ranging from not less than room temperature to not more than 150° C.

16. The method for fabricating a piezoelectric device as set forth in claim 13, wherein the step (i) is carried out through a physical vapor deposition process.

17. The piezoelectric device as set forth in claim 4, wherein the surface layer of the conducting layer is made of a metal whose electronegativity ranges from not less than 1.3 to not more than 1.5.

18. The piezoelectric device as set forth in claim 3, wherein the second electrode layer has a lamination structure having a plurality of conducting layers.

19. The method for fabricating a piezoelectric device as set forth in claim 14, wherein, in the step (i), a film is fabricated by metal at a temperature ranging from not less than room temperature to not more than 150° C.

20. The method for fabricating a piezoelectric device as set forth in claim 14, wherein the step (i) is carried out through a physical vapor deposition process.

* * * * *